United States Patent
Wu et al.

(10) Patent No.: US 9,898,569 B2
(45) Date of Patent: Feb. 20, 2018

(54) SEMICONDUCTOR LAYOUT STRUCTURE AND DESIGNING METHOD THEREOF

(71) Applicant: UNITED MICROELECTRONICS CORP., Hsin-Chu (TW)

(72) Inventors: Chun-Hsien Wu, New Taipei (TW); Chen-Hsien Hsu, Hsinchu County (TW); Wei-Jen Wang, Tainan (TW); Chien-Fu Chen, Miaoli County (TW); Chien-Hung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/852,635

(22) Filed: Sep. 14, 2015

(65) Prior Publication Data

US 2017/0039311 A1  Feb. 9, 2017

(30) Foreign Application Priority Data

Aug. 5, 2015 (TW) .............................. 104125336 A

(51) Int. Cl.
*H01L 21/70* (2006.01)
*G06F 17/50* (2006.01)
*H01L 27/02* (2006.01)

(52) U.S. Cl.
CPC ...... *G06F 17/5072* (2013.01); *H01L 27/0207* (2013.01)

(58) Field of Classification Search
USPC ........................................................ 257/499
See application file for complete search history.

(56) References Cited

U.S. PATENT DOCUMENTS

| 7,932,566 B2 | 4/2011 | Hou et al. | |
|---|---|---|---|
| 8,739,104 B1 | 5/2014 | Penzes et al. | |
| 8,756,550 B2 | 6/2014 | Blatchford | |
| 8,943,455 B2 | 1/2015 | Chen et al. | |
| 2007/0035031 A1* | 2/2007 | Jessen ....................... | G03F 1/36 257/774 |
| 2008/0094870 A1* | 4/2008 | Tsujimura .............. | G11C 5/063 365/72 |
| 2010/0164614 A1* | 7/2010 | Hou .................... | G06F 17/5072 327/565 |
| 2010/0181600 A1* | 7/2010 | Law .................... | G06F 17/5045 257/204 |
| 2011/0075470 A1* | 3/2011 | Liaw ....................... | G11C 8/16 365/154 |

(Continued)

*Primary Examiner* — Sitaramarao S Yechuri
(74) *Attorney, Agent, or Firm* — Winston Hsu

(57) ABSTRACT

A method for designing a semiconductor layout structure includes following steps. A first active feature group including at least a first active feature is received, and the first active feature includes a first channel length. A pair of first dummy features is introduced to form a first cell pattern. The first dummy features include a first dummy width. A first spacing width is defined between the first active feature group and one of the first dummy features and a third spacing width is defined between the first active feature group and the other first dummy feature. The first cell pattern includes a first cell width and a first poly pitch, and the first cell width is a multiple of the first pitch. The receiving of the first active feature group and the introducing of the first dummy features are performed in by at least a computer-aided design tool.

17 Claims, 7 Drawing Sheets

(56) References Cited

U.S. PATENT DOCUMENTS

| | | | |
|---|---|---|---|
| 2011/0147765 A1* | 6/2011 | Huang | H01L 21/28123 257/77 |
| 2011/0156755 A1* | 6/2011 | Veendrick | H01L 27/0207 326/103 |
| 2012/0032293 A1* | 2/2012 | Chen | H01L 21/28123 257/499 |
| 2012/0180016 A1* | 7/2012 | Chidambaram | H01L 27/11807 716/119 |
| 2013/0069081 A1* | 3/2013 | Blatchford | H01L 27/088 257/77 |
| 2015/0145070 A1* | 5/2015 | Song | H01L 21/28123 257/401 |

* cited by examiner

SEMICONDUCTOR LAYOUT STRUCTURE AND DESIGNING METHOD THEREOF

BACKGROUND OF THE INVENTION

1. Field of the Invention

The invention relates to a semiconductor layout structure and a designing method thereof, and more particularly, to a semiconductor layout structure including a cell width being a multiple of a poly pitch and a designing method thereof.

2. Description of the Prior Art

Semiconductor integrated circuits are one of the most important hardware used in the modern information society. A key design point of the semiconductor industry is to increase integration of integrated circuits, and therefore to use the area of integrated circuits (ICs) more efficiently. Generally speaking, ICs having complex functions are made up of many standard cells, each with basic functions. Since those standard cells are essential elements for constructing ICs, layout structures of those standard cells enormously affect the whole layout structure of the ICs.

Conventional standard cells can include different cell widths, and when the cell width is a multiple of the poly pitch, it is concluded that such standard cell is an on-grid layout structure. The on-grid layout structure improves the efficiency of placement and routing (P&R) for IC design. Additionally, in some software tool, it only takes the on-grid layout structure for placement and routing. In other words, different standard cells can be easily integrated into one chip when it include the on-grid layout structure. However, the cell width depends on the complexity of the standard cell: complex standard cell includes larger cell width. Furthermore, not all standard cells in the state-of-the-art include the on-grid layout structure.

Therefore it is still in need to provide a method for designing semiconductor layout structure such that standard cells of different cell widths can all include the on-grid layout structure.

SUMMARY OF THE INVENTION

According to the claimed invention, a method for designing a semiconductor layout structure is provided. The method includes following steps. A first active feature group is provided. The first active feature group includes at least a first active feature, and the first active feature includes a first channel length. Subsequently, a pair of first dummy features is introduced at two sides of the first active feature group to form a first cell pattern. The first dummy features respectively include a first dummy width. The first active feature group and one of the first dummy features include a first spacing width defined therebetween, and the first active feature group and the other first dummy feature include a third spacing width defined therebetween. The first cell pattern further includes a first cell width and a first poly pitch, and the first cell width is a multiple of the first poly pitch. Furthermore, the receiving of the first active feature group and the introducing of the first dummy features to form the first cell pattern are performed in by at least a computer-aided design (hereinafter abbreviated as CAD) tool.

According to the claimed invention, a semiconductor layout structure is provided. The semiconductor layout structure includes a substrate and at least a first cell pattern including a first cell width. The first cell pattern further includes a pair of first dummy features and a first active feature group sandwiched between the pair of first dummy features. The first dummy features respectively include a first dummy width. The first active feature group includes at least a first active feature, and the first active feature includes a first channel length. The first cell pattern further includes a first poly pitch, and the first cell width is a multiple of the first poly pitch.

According to the method for designing the semiconductor layout structure provided by the present invention, the first dummy width of the first dummy features and the spacing width between the first active feature group and the first dummy features to be formed are obtained by calculating or by querying a look-up table after receiving the first active feature group. Then the pair of the first dummy features is introduced at the two sides of the first active feature group. Accordingly, by providing the first dummy width and the spacing width between the first active feature group and the first dummy features, the final cell pattern always obtains a cell width being a multiple of the poly pitch, and thus the cell pattern is always an on-grid layout structure. That is, according to the method provided by the present invention, cell patterns including different poly pitches can all be on-grid patterns. Consequently, semiconductor layout structures obtained by the method provided by the present invention are all on-grid structures. And thus the semiconductor layout structures can be easily integrated into one chip regardless of the size of the cell patterns. Eventually, the semiconductor layout structure and the designing method thereof provided by the present invention are able to comply with the integration requirements and to improve the integration efficiency.

These and other objectives of the present invention will no doubt become obvious to those of ordinary skill in the art after reading the following detailed description of the preferred embodiment that is illustrated in the various figures and drawings.

DETAILED DESCRIPTION

Typically speaking, an integrated circuit design flow can be summarized as: an idea is produced and realized in a CAD tool, which is also known as an electronic design automation (EDA). When the design is finalized, the fabrication process and packaging and assembly processes are performed and ultimately resulting in finished integrated circuit chips.

Figure 1:
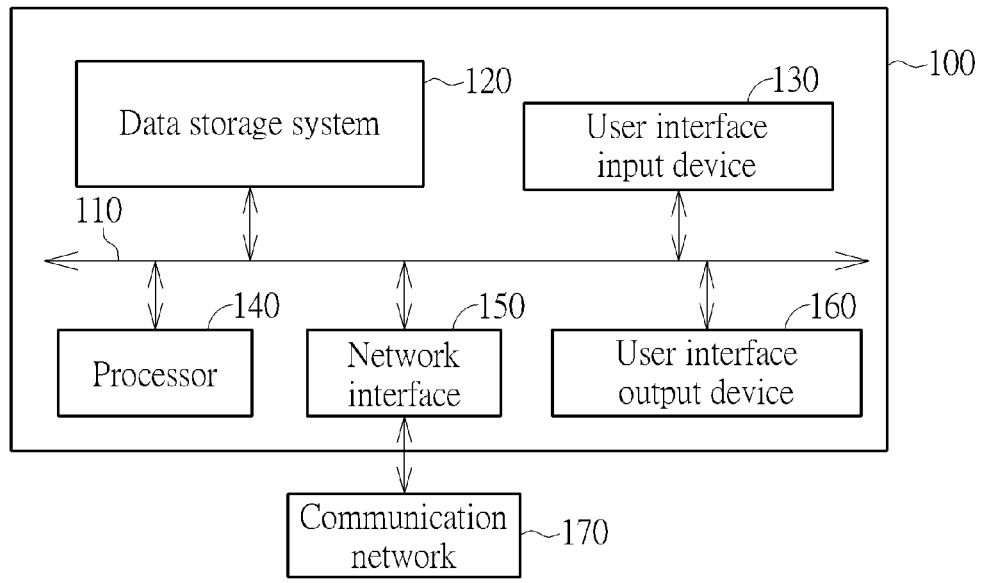
FIG. 1 illustrates a computer system suitable for use with embodiments of the present invention.

Please refer to FIG. 1, which illustrates a computer system suitable for use with embodiments of the present invention. The computer system 100 includes a system bus 110, a data storage system 120, a user interface input device 130, a processor 140, a network interface 150, and a user interface output device 160. The data storage system 120 provides persistent storage for program and data files. In the present invention, the data storage system 120 provides one or more CAD tool functions. The user interface input device 130 and the user interface output device 160 includes all possible types of device and ways to input/output information into or from the computer system 100. The network interface 150 serves as an interface to outside networks and is coupled to corresponding interface devices in other computer systems via a communication network 170. Additionally, the computer system 100 itself can be of varying types including a personal computer, a portable computer, a workstation, a computer terminal, a network computer or user device. The computer system 100 is exemplarily shown in FIG. 1, and those skilled in the art would easily realize that the computer system 100 can include other components or elements.

Figure 2:
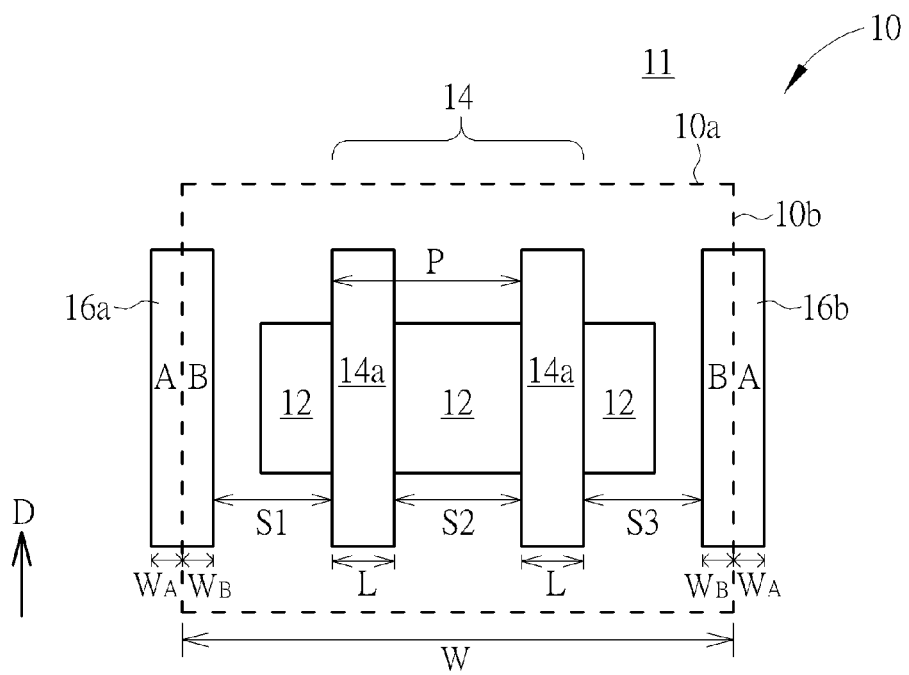
FIG. 2 is a schematic drawing illustrating a layout structure of a standard cell provided by the present invention.

Please refer to FIG. 2, which is a schematic drawing illustrating a layout structure of a standard cell provided by the present invention. As shown in FIG. 2, the layout structure of the standard cell 10 includes a substrate 11, a pair of cell boundaries 10a parallel with each other, another pair of cell boundaries 10b parallel with each other, at least an active region 12 formed within the cell boundaries 10a/10b, an active feature group 14 formed on the active region 12 in the cell boundary 10a/10b, and a pair of dummy features 16a/16b formed at two sides of the active feature group 14. The active feature group 14 can include one or a plurality of active features 14a. The active features 14a and the dummy features 16a/16b are all extended along a direction D. In other words, the active features 14a and the dummy features 16a/16b are parallel with each other. The layout structure of the standard cell 10 includes a cell width W perpendicular to the direction D, and each of the active features 14a includes an active feature width. More important, the active feature width is referred to as a channel width L of a field effect transistor (FET) device. The active feature group 14 and the dummy feature 16a include a first spacing width S1 defined therebetween, and the active feature group 14 and the other dummy feature 16b include a third spacing width S3 defined therebetween. It is noteworthy that in the case that the active feature group 14 includes a plurality of active features 14a, any adjacent two active features 14a include a second spacing width S2 defined therebetween. The layout structure of the standard cell 10 further includes a poly pitch P, which is a sum of channel length L and the second spacing width S2. It is also noteworthy that in the conventional layout structure of standard cell, the cell width is a sum of a width of the active feature group (which is a sum of the widths of all active features and all second spacing width in the active feature group), the first spacing width, the third spacing width, and dummy widths of the dummy features. However, according to the preferred embodiment of the present invention, a calculation of the cell width W is different: As shown in FIG. 2, the cell boundaries 10b are parallel with a long axis of the dummy features 16a/16b and penetrates the dummy features 16a/16b along its long axis. Consequently, the dummy features 16a/16b respectively includes an inner portion B and an outer portion A divided and defined by the cell boundaries 10b. The outer portion A includes an outer width $W_A$ and the inner portion B includes an inner width $W_B$. And the cell width W is a sum of a width of the active feature group 14 (which is a sum of the widths of all active features 14a and all second spacing width S2 in the active feature group 14), the first spacing width S1, the third spacing width S3, and the inner width $W_B$ of the inner portions B of the dummy features 16a/16b in accordance with the present invention. Please note that the cell width, the cell boundary, the active feature group (including one or a plurality of active features), the dummy features, the first spacing width, the second spacing width, and the third spacing width are adopted in the method for designing the semiconductor layout structure provided in the following detailed description of the preferred embodiment.

Figure 3:
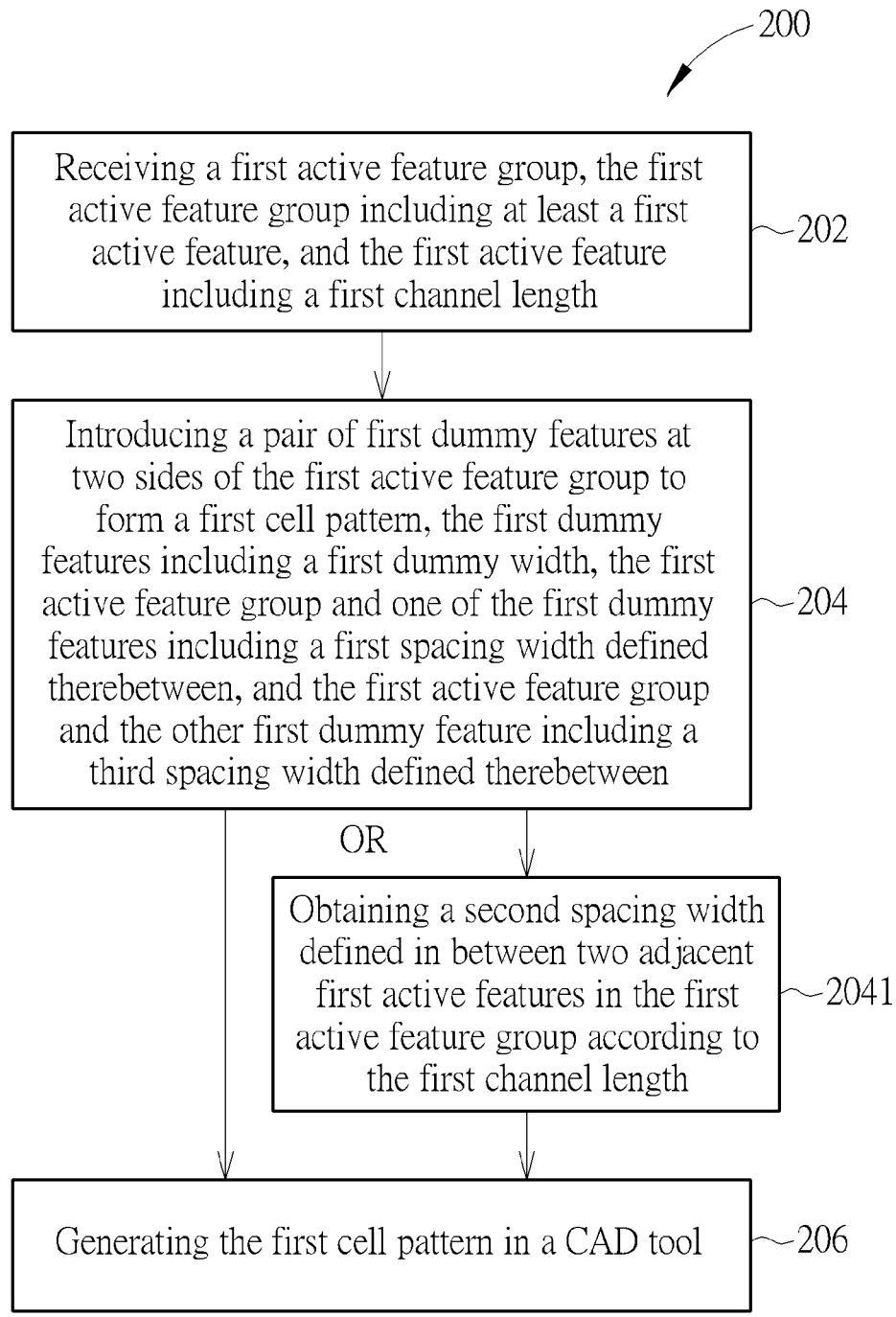
FIG. 3 is a flow chart of a method for designing a semiconductor layout structure provided by the present invention.

Please refer to FIG. 3, which is a flow chart of a method for designing a semiconductor layout structure provided by the present invention. As shown in FIG. 3, the method for designing the semiconductor layout structure 200 provided by the present invention includes:

STEP 202: Receiving a first active feature group, the first active feature group including at least a first active feature, and the first active feature including a first channel length.

STEP 204: Introducing a pair of first dummy features at two sides of the first active feature group to form a first cell pattern, the first dummy features including a first dummy width, the first active feature group and one of the first dummy features including a first spacing width defined therebetween, and the first active feature group and the other first dummy feature including a third spacing width defined therebetween.

It is noteworthy that the first active feature group can include one or a plurality of first active features. In the case that the first active feature group includes a plurality of first active features, the following step is performed:

STEP 2041: Obtaining a second spacing width defined in between two adjacent first active features in the first active feature group according to the first channel length.

STEP 206: Generating the first cell pattern in a CAD tool.

It should be noted that the abovementioned STEP 200-STEP 206 are all performed at least in the CAD tool. More important, the first cell pattern obtained by the method for designing the semiconductor layout structure includes a first cell width and a first poly pitch, and the first cell width is a multiple of the first poly pitch.

The method for designing the semiconductor layout structure 200 provided by the present invention is further detailed: At the beginning, an initial channel length L3 and a minimum active feature spacing width S are obtained. It is noteworthy that the initial channel length L3 usually can be further decreased depending on process or product requirements. In detail, the initial channel length L3 is linearly decreased by a predetermined variable δL obtained from a database or a standard cell library. For example, after obtaining the initial channel length L3, it can be decreased by the predetermined variable δL to obtain a primary decreased channel length L2, and be further decreased by the predetermined variable δL again to obtain a secondary decreased channel length L3. That is, the primary decreased channel length L2=L3−δL and the secondary decreased channel length L1=L3−2δL are obtained. According to the initial channel length L3, the predetermined variable δL and the minimum active feature spacing width S, parameters for the standard cell including the initial channel length L3, the standard cell including the primary decreased channel length L2, and the standard cell including the secondary decreased the channel length L1 can be obtained. It is also noteworthy that the even initial channel length L3 and the odd initial channel length L3 lead to different calculation methodologies. When the initial channel length L3 is an even number, a calculation methodology is provided and tabulated in TABLE 1:

TABLE 1

Unit: nanometer (nm)

| | Channel Length L | Outer Width $W_A$ | Inner Width $W_B$ | First Spacing Width S1 | Second Spacing Width S2 | Third Spacing Width S3 |
|---|---|---|---|---|---|---|
| The first standard cell | L3 | (L3 − 2δL)/2 | (L3)/2 | S | S | S |
| The second standard cell | L3 − δL | (L3 − 2δL)/2 | (L3)/2 | S | S + δL | S + δL |
| The third standard cell | L3 − 2δL | (L3 − 2δL)/2 | (L3 − 2δL)/2 | S + 2δL | S + 2δL | S + 2δL |

In a preferred embodiment of the present invention, the initial channel length L3=40, the predetermined variable δL=5, and the minimum active feature spacing width S=100. Since the initial channel length L3 is an even number, the abovementioned calculation methodology is adopted and thus a TABLE 2 is obtained:

TABLE 2

Unit: nm

| | Channel Length L | Outer width $W_A$ | Inner width $W_B$ | First spacing width S1 | Second spacing width S2 | Third spacing width S3 |
|---|---|---|---|---|---|---|
| The first standard cell | L3 = 40 | 15 | 20 | 100 | 100 | 100 |
| The second standard cell | L2 = 35 | 15 | 20 | 100 | 105 | 105 |
| The third standard cell | L1 = 30 | 15 | 15 | 110 | 110 | 110 |

After obtaining the TABLE 2, the method for designing the semiconductor layout structure 200 is performed.

Figure 4:
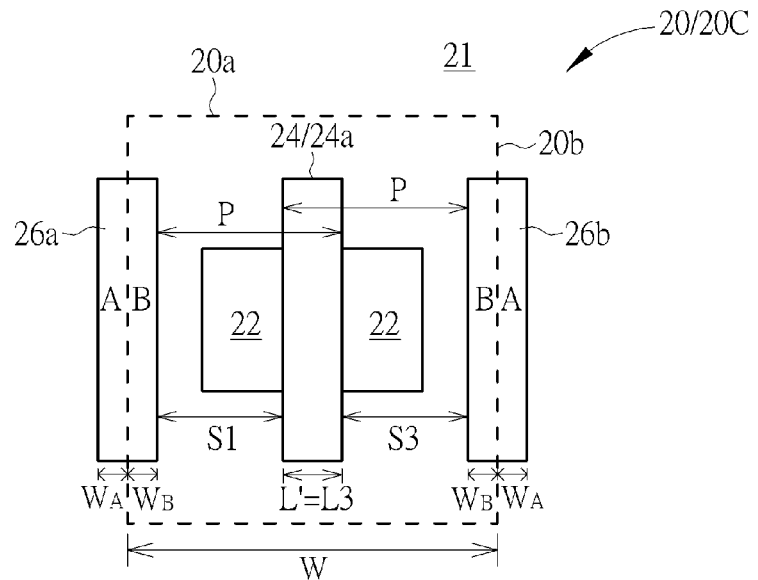
FIG. 4 is a schematic drawing illustrating a semiconductor layout structure obtained by performing the method for designing the semiconductor layout structure provided by a first preferred embodiment of the present invention.

Please refer to FIG. 4, which is a schematic drawing illustrating a semiconductor layout structure obtained by performing the method for designing the semiconductor layout structure provided by a first preferred embodiment of the present invention. According to the preferred embodiment, STEP 202 is performed, and an active feature group 24 is received. In the preferred embodiment, the active feature group 24 includes only one active feature 24a. The active feature 24a includes a channel length L'. According to the preferred embodiment, the channel length L'=L3, the predetermined variable δL=5, and the minimum active feature spacing width S=100 according to a database or a standard cell library.

Next, STEP 204 is performed and a pair of dummy features 26a/26b is introduced at two opposite sides of the active feature group 24 and thus a cell pattern 20 is formed. More important, a width of the dummy features 26a/26b, a first spacing width S1 defined between the active feature group 24 and the dummy feature 26a, a third spacing width S3 defined between the active feature group 24 and the dummy feature 26b are obtained by performing the calculation methodology as shown in TABLE 1 or by querying the look-up TABLE 2. It is also noteworthy that the width of the dummy features 26a/26b is a sum of the outer width $W_A$ and the inner width $W_B$. According to TABLE 1 or TABLE 2, the channel length L'=L3=40, the outer width $W_A$=15, the inner width $W_B$=20, the first spacing width S1=100, and the third spacing width S3=100 in the preferred embodiment. After obtaining the aforementioned parameters, STEP 206 is performed to generate the cell pattern 20 in the CAD tool. Subsequently, the cell pattern 20 is outputted to a photo mask and then transferred to a semiconductor substrate 21 including at least an active region 22, and thus a semiconductor layout structure 20C is obtained.

According to the preferred embodiment, the semiconductor layout structure 20C/the cell pattern 20 can be a layout structure to be abutted to other layout structure, therefore the cell width W of the semiconductor layout structure 20C is a distance between the cell boundaries 20b as shown in FIG. 4. That is, the cell width W of the semiconductor layout structure 20C/the cell pattern 20 is a sum of the inner width $W_B$ of the dummy feature 26a, the inner width $W_B$ of the dummy feature 26b, the first spacing width S1, the channel length L', and the third spacing width S3:

$$W=2*W_B+S1+L'+S3=2*20+100+40+100=280$$

Furthermore, the semiconductor layout structure 20C/the cell pattern 20 includes a poly pitch P, and the poly pitch P is a sum of the channel length L' of the active feature 24a and the first spacing width S1 or a sum of the channel length L' of the active feature 24a and the third spacing width S3:

$$P=S1+L \text{ or } S1+L3=100+40 \text{ or } 40+100=140$$

More important, the cell width W of the semiconductor layout structure 20C/the cell pattern 20 provided by the preferred embodiment is a multiple of the poly pitch: W=280=(140)*2=P*2. It is therefore concluded that the semiconductor layout structure 20 is an on-grid layout structure.

According to the method for designing the semiconductor layout structure provided by the first preferred embodiment, the pair of dummy features 26a/26b is introduced at the two sides of the active feature group 24 to form the cell pattern 20 after receiving the active feature group 24 and obtaining the first dummy width $W_A+W_B$ and spacing widths S1/S3 by calculating or by querying the look-up table. Accordingly, the cell width W of the cell pattern 20 is ensured to be a multiple of the poly pitch P, and thus the final semiconductor layout structure 20C is ensured to be an on-grid layout structure.

Figure 5:
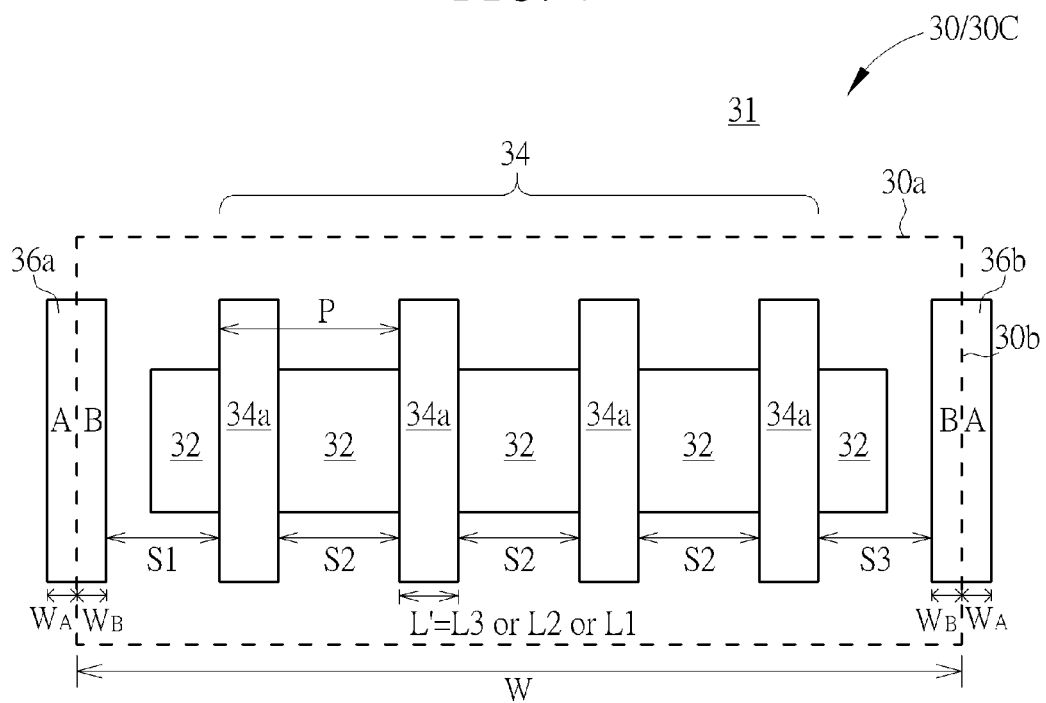
FIG. 5 is a schematic drawing illustrating a semiconductor layout structure obtained by performing the method for designing the semiconductor layout structure provided by a second preferred embodiment to a fourth preferred embodiment of the present invention.

Please refer to FIG. 5, which is a schematic drawing illustrating a semiconductor layout structure obtained by performing the method for designing the semiconductor layout structure provided by a second preferred embodiment to a fourth preferred embodiment of the present invention. Please note that though parameters may be different in the second to fourth preferred embodiments, it can still be illustrated as shown in FIG. 5. According to the preferred embodiment, STEP 202 is performed, and an active feature group 34 is received. In the preferred embodiment, the active feature group 34 includes a plurality of active features 34a. The active features 34a include a channel length L', and a second spacing width S2 is defined in any adjacent two active features 34a. According to the preferred embodiment, the channel length L'=L3, the predetermined variable δL=5, and the minimum active feature spacing width S=100 according to a database or a standard cell library.

Next, STEP 204 is performed and a pair of dummy features 36a/36b is introduced at two opposite sides of the active feature group 34 and thus a cell pattern 30 is formed. More important, a width of the dummy features 36a/36b, a first spacing width S1 between the active feature group 34 and the dummy feature 36a, a second spacing width S2 between any two adjacent active features 34a, and a third spacing width S3 between the active feature group 34 and the dummy feature 36b are obtained by performing the calculation methodology as shown in TABLE 1 or by querying the look-up TABLE 2. It is also noteworthy that the width of the dummy features 36a/36b is a sum of the outer width $W_A$ and the inner width $W_B$. According to TABLE 1 or TABLE 2, the channel length L'=L3=40, the outer width $W_A$=15, the inner width $W_B$=20, the first spacing width S1=100, the second spacing width S2=100, and the third spacing width S3=100 in the preferred embodiment. After obtaining the aforementioned parameters, STEP 206 is performed to generate the cell pattern 30 in the CAD tool. Subsequently, the cell pattern 30 is outputted to a photo mask and then transferred to a semiconductor substrate 31 including at least an active region 32, and thus a semiconductor layout structure 30C is obtained.

According to the preferred embodiment, the semiconductor layout structure 30C/the cell pattern 30 can be a layout structure to be abutted to other layout structure, therefore the cell width W of the semiconductor layout structure 30C is a distance between the cell boundary 30b as shown in FIG. 5. That is, the cell width W of the semiconductor layout structure 30C/the cell pattern 30 is a sum of the inner width $W_B$ of the dummy features 36, the inner width $W_B$ of the dummy features 36, the first spacing width S1, the channel lengths L' of all active features 34a in the active feature group 34, all second spacing widths S2 in the active feature group 34, and the third spacing width S3:

$$W = 2*W_B + S1 + n*L' + (n-1)*S2 + S3$$
$$= 2*20 + 100 + 4*40 + 3*100 + 100$$
$$= 700$$

As mentioned above, the semiconductor layout structure 30C/the cell pattern 30 includes a poly pitch P, and the poly pitch P is a sum of the channel length L' of the active feature 34a and the second spacing width S2:

$$P=L'+S2=40+100=140$$

More important, the cell width W of the semiconductor layout structure 30C/the cell pattern 30 provided by the preferred embodiment is a multiple of the poly pitch: W=700=(140)*5=P*5. It is therefore concluded the semiconductor layout structure 30C is an on-grid layout structure.

According to the third preferred embodiment of the present invention, STEP 202 is performed, and an active feature group 34 is received. In the preferred embodiment, the active feature group 34 includes a plurality of active features 34a. The active features 34a include a channel length L', and a second spacing width S2 is defined in any adjacent two active features 34a. According to the preferred embodiment, the channel length L'=L2, the predetermined variable δL=5, and the minimum active feature spacing width S=100 according to a database or a standard cell library. Next, STEP 204 is performed and a pair of dummy features 36a/36b is introduced at two opposite sides of the active feature group 34, and thus a cell pattern 30 is formed. As mentioned above, a width of the dummy features 36a/36b, a first spacing width S1 between the active feature group 34 and the dummy feature 36a, a second spacing width S2 between any adjacent two active features 34a, and a third spacing width S3 between the active feature group 34 and the dummy feature 36b are obtained by performing the calculation methodology as shown in TABLE 1 or by querying the look-up TABLE 2. Also as mentioned above, the width of the dummy features 36a/36b is a sum of the outer width $W_A$ and the inner width $W_B$. According to TABLE 1 or TABLE 2, the channel length L'=L2=35, the outer width $W_A$=15, the inner width $W_B$=20, the first spacing width S1=100, the second spacing width S2=105, and the third spacing width S3=105 in the preferred embodiment. It should be noted that in the preferred embodiment, the first spacing width S1=100 and the third spacing width S3=105, however, the values of the first spacing width S1 and the third spacing width S3 are interchangeable if required. After obtaining the aforementioned parameters, STEP 206 is performed to generate the cell pattern 30 in the CAD tool. Subsequently, the cell pattern 30 is outputted to a photo mask and then transferred to a semiconductor substrate 31 including at least an active region 32, and thus a semiconductor layout structure 30C is obtained.

As mentioned above, a cell width W of the semiconductor layout structure 30/the cell pattern 30C is a distance between the cell boundaries 30b as shown in FIG. 5. That is, the cell width W of the semiconductor layout structure 30C/the cell pattern 30 is a sum of the inner width $W_B$ of the dummy feature 36a, the inner width $W_B$ of the dummy feature 36b, the first spacing width S1, the channel lengths L' of all active features 34a in the active feature group 34, all second spacing widths S2 in the active feature group 34, and the third spacing width S3:

$$W = 2*W_B + S1 + n*L' + (n-1)*S2 + S3$$
$$= 2*20 + 100 + 4*35 + 3*105 + 105$$
$$= 700$$

As mentioned above, the semiconductor layout structure 30C/the cell pattern 30 includes a poly pitch P, and the poly pitch P is a sum of the channel length L' of the active feature 34a and the second spacing width S2:

$$P=L'+S2=35+105=140$$

More important, the cell width W of the semiconductor layout structure 30C/the cell pattern 30 provided by the preferred embodiment is a multiple of the poly pitch: W=700=(140)*5=P*5. It is therefore concluded the semiconductor layout structure 30C is an on-grid layout structure.

According to the fourth preferred embodiment of the present invention, STEP 202 is performed, and an active feature group 34 is received. In the preferred embodiment, the active feature group 34 includes a plurality of active features 34a. The active features 34a include a channel length L', and a second spacing width S2 is defined in any adjacent two active features 34a. According to the preferred embodiment, the channel length L'=L1, the predetermined variable δL=5, and the minimum active feature spacing width S=100 according to a database or a standard cell library. Next, STEP 204 is performed and a pair of dummy features 36a/36b is introduced at two opposite sides of the active feature group 34, and thus a cell pattern 30 is formed. More important, a width of the dummy features 36a/36b, a first spacing width S1 between the active feature group 34 and the dummy feature 36a, a second spacing width S2 between any two adjacent active features 34a, and a third spacing width S3 between the active feature group 34 and the dummy feature 36b are obtained by performing the calculation methodology as shown in TABLE 1 or by querying the look-up TABLE 2. As mentioned above, the width of the dummy features 36a/36b is a sum of the outer width $W_A$ and the inner width $W_B$. According to TABLE 1 or TABLE 2, the channel length L'=L1=30, the outer width $W_A$=15, the inner width $W_B$=15, the first spacing width S1=110, the second spacing width S2=115, and the third spacing width S3=115 in the preferred embodiment. After obtaining the aforementioned parameters, STEP 206 is performed to generate the cell pattern 30 in the CAD tool. Subsequently, the cell pattern 30 is outputted to a photo mask and then transferred to a semiconductor substrate 31 including at least an active region 32, and thus a semiconductor layout structure 30C is obtained.

As mentioned above, a cell width W of the semiconductor layout structure 30/the cell pattern 30C is a distance between the cell boundaries 30b as shown in FIG. 5. That is, the cell width W of the semiconductor layout structure 30C/the cell pattern 30 is a sum of the inner width $W_B$ of the dummy feature 36a, the inner width $W_B$ of the dummy feature 36b, the first spacing width S1, the channel lengths L' of all active features 34a in the active feature group 34, all second spacing widths S2, and the third spacing width S3:

$$W = 2*W_B + S1 + n*L' + (n-1)*S2 + S3$$
$$= 2*15 + 110 + 4*30 + 3*110 + 110$$
$$= 700$$

As mentioned above, the semiconductor layout structure 30C/the cell pattern 30 includes a poly pitch P, and the poly pitch P is a sum of the channel length L' of the active feature 34a and the second spacing width S2:

$$P = L' + S2 = 30 + 110 = 140$$

More important, the cell width W of the semiconductor layout structure 30C/the cell pattern 30 provided by the preferred embodiment is a multiple of the poly pitch: W=700=(140)*5=P*5. It is therefore concluded the semiconductor layout structure 30C is an on-grid layout structure.

Additionally, though the active feature group 34 includes four active features 34a in the second to fourth preferred embodiments, the amounts of the active features 34a in the active feature group 34 should not be limited to this. Those skilled in the art would easily realize that the amount of the active features 34a can be increased or decreased depending on different product requirements.

According to the method for designing the semiconductor layout structure provided by the second to fourth preferred embodiments, the pair of dummy features 36a/36b is introduced at the two sides of the active feature group 34 to form the cell pattern 30 after receiving the active feature group 34 and obtaining the first dummy width $W_A+W_B$, the spacing width S2 between active features 34a, and spacing widths S1/S3 by calculating or by querying the look-up table. Accordingly, the cell width W of the cell pattern 30 is ensured to be a multiple of the poly pitch P, and thus the final semiconductor layout structure 30C is ensured to be an on-grid layout structure regardless of the size of the channel length L'.

The method for designing the semiconductor layout structure 200 provided by the present invention is further detailed: At the beginning, an initial channel length L3 and a minimum active feature spacing width S are obtained. It is noteworthy that the initial channel length L3 usually can be further decreased depending on process or product requirements. In detail, the initial channel length L3 is linearly decreased by a predetermined variable δL obtained from a database or a standard cell library. For example, after obtaining the initial channel length L3, it can be decreased by the predetermined variable δL to obtain a primary decreased channel length L2, and be further decreased by the predetermined variable δL again to obtain a secondary decreased channel length L1. That is, the primary decreased channel length L2=L3−δL and the secondary decreased channel length L1=L3−2δL are obtained. According to the initial channel length L3, the predetermined variable δL and the minimum active feature spacing width S, parameters for the standard cell including the initial channel length L3, the standard cell including the primary decreased channel length L2, and the standard cell including the secondary decreased the channel length L1 can be obtained. As mentioned above, the even initial channel length L3 and the odd initial channel length L3 lead to different calculation methodologies. When the initial channel length L3 is an odd number, a calculation methodology is provided and tabulated in TABLE 3:

TABLE 3

Unit: nm

| | Channel length L | Outer Width $W_A$ | Inner Width $W_B$ | First Spacing Width S1 | Second Spacing Width S2 | Third Spacing Width S3 |
|---|---|---|---|---|---|---|
| The first standard cell | L3 | (L3)/2 | (L3)/2 | S | S | S |
| The second standard cell | L3 − δL | (L3 − δL)/2 | (L3 − δL)/2 | S + δL | S + δL | S + δL |
| The third standard cell | L3 − 2δL | (L3 − 2δL)/2 | (L3 − 2δL)/2 | S + 2δL | S + 2δL | S + 2δL |

In a preferred embodiment of the present invention, the initial channel length L3=35, the predetermined variable δL=5, and the minimum active feature spacing width S=100. Since the initial channel length L3 is an odd number, the abovementioned calculation methodology is adopted and thus a TABLE 4 is obtained:

TABLE 4

| | Unit: nm | | | | |
|---|---|---|---|---|---|
| | Channel Length L | Outer width $W_A$ | Inner width $W_B$ | First Spacing Width S1 | Second Spacing Width S2 | Third Spacing Width S3 |
| The first standard cell | 35 | 17.5 | 17.5 | 100 | 100 | 100 |
| The second standard cell | 30 | 15 | 15 | 105 | 105 | 105 |
| The third standard cell | 25 | 12.5 | 12.5 | 110 | 110 | 110 |

After obtaining the TABLE 4, the method for designing the semiconductor layout structure 200 is performed.

Figure 6:
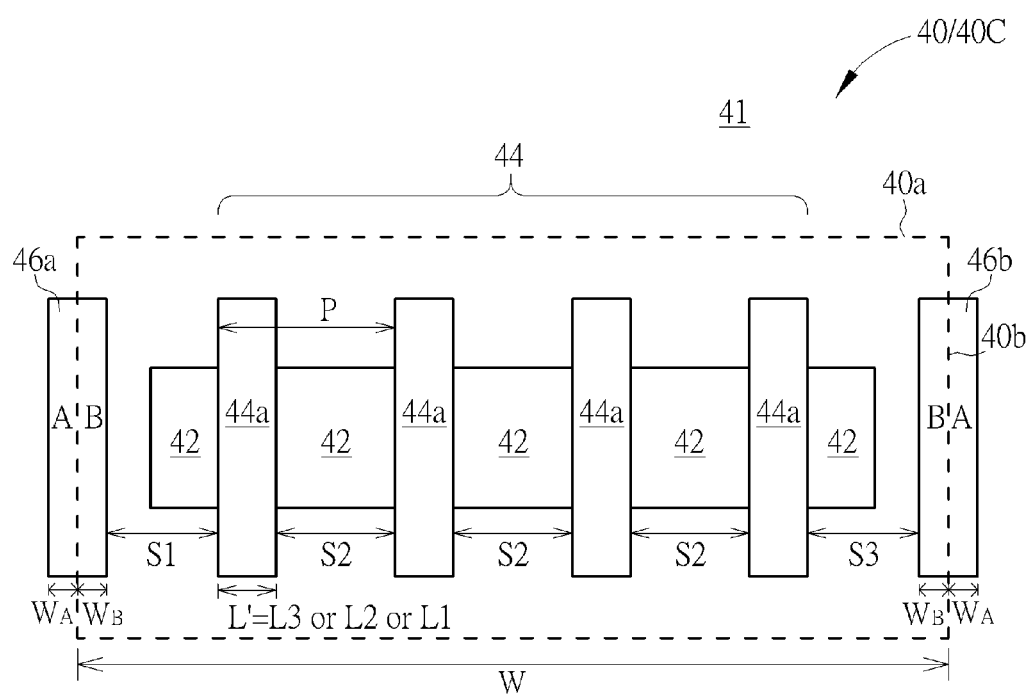
FIG. 6 is a schematic drawing illustrating a semiconductor layout structure obtained by performing the method for designing the semiconductor layout structure provided by a fifth preferred embodiment to a seventh preferred embodiment of the present invention.

Please refer to FIG. 6, which is a schematic drawing illustrating a semiconductor layout structure obtained by performing the method for designing the semiconductor layout structure provided by a fifth preferred embodiment to a seventh preferred embodiment of the present invention. It should be noted that though parameters may be different in the fifth to seventh preferred embodiments, it can still be illustrated as shown in FIG. 6. According to the preferred embodiment, STEP 202 is performed, and an active feature group 44 is received. In the preferred embodiment, the active feature group 44 includes a plurality of active features 44a. The active features 44a respectively include a channel length L', and a second spacing width S2 is defined in between any adjacent two active features 44a. According to the preferred embodiment, the channel length L'=L3, the predetermined variable δL=5, and the minimum active feature spacing width S=100 according to a database or a standard cell library.

Next, STEP 204 is performed and a pair of dummy features 46a/46b is introduced at two opposite sides of the active feature group 44 and thus a cell pattern 40 is formed. More important, a width of the dummy features 46a/46b, a first spacing width S1 defined between the active feature group 44 and the dummy feature 46a, the second spacing width S2 between the active features 44a, and a third spacing width S3 defined between the active feature group 44 and the dummy feature 46b are obtained by performing the calculation methodology as shown in TABLE 3 or by querying the look-up TABLE 4. It is also noteworthy that the width of the dummy features 46a/46b is a sum of the outer width $W_A$ and the inner width $W_B$. According to TABLE 3 or TABLE 4, the channel length L'=L3=35, the outer width $W_A$=17.5, the inner width $W_B$=17.5, the first spacing width S1=100, the second spacing width S2=100, and the third spacing width S3=100 in the preferred embodiment. After obtaining the aforementioned parameters, STEP 206 is performed to generate the cell pattern 40 in the CAD tool. Subsequently, the cell pattern 40 is outputted to a photo mask and then transferred to a semiconductor substrate 41 including at least an active region 42, and thus a semiconductor layout structure 40C is obtained.

According to the preferred embodiment, the semiconductor layout structure 40C/the cell pattern 40 can be a layout structure to be abutted to other layout structure, therefore the cell width W of the semiconductor layout structure 40C is a distance between the cell boundaries 40b as shown in FIG. 6. That is, the cell width W of the semiconductor layout structure 40C/the cell pattern 40 is a sum of the inner width $W_B$ of the dummy feature 46a, the inner width $W_B$ of the dummy feature 46b, the first spacing width S1, the channel lengths L' of all active features 44a in the active feature group 44, all second spacing widths S2 in the active feature group 44, and the third spacing width S3:

$$W = 2*W_B + S1 + n*L' + (n-1)*S2 + S3$$
$$= 2*17.5 + 100 + 3*35 + 2*100 + 100$$
$$= 540$$

Furthermore, the semiconductor layout structure 40C/the cell pattern 40 include a poly pitch P, and the poly pitch P is a sum of the channel length L' of the active feature 44a and the second spacing width S2:

$$P=L'+S2=35+100=135$$

More important, the cell width W of the semiconductor layout structure 40C/the cell pattern 40 provided by the preferred embodiment is a multiple of the poly pitch: W=540=(135)*4=P*4. It is therefore concluded that the semiconductor layout structure 40C is an on-grid layout structure.

According to the sixth preferred embodiment of the present invention, STEP 202 is performed, and an active feature group 44 is received. In the preferred embodiment, the active feature group 44 includes a plurality of active features 44a. The active features 44a include a channel length L', and a second spacing width S2 is defined in any adjacent two active features 44a. According to the preferred embodiment, the channel length L'=L2, the predetermined variable δL=5, and the minimum active feature spacing width S=100 according to a database or a standard cell library. Next, STEP 204 is performed and a pair of dummy features 46a/46b is introduced at two opposite sides of the active feature group 44, and thus a cell pattern 40 is formed. As mentioned above, a width of the dummy features 46a/46b, a first spacing width S1 between the active feature group 44 and the dummy feature 46a, the second spacing width S2 between any adjacent two active features 44a in the active feature group 44, and a third spacing width S3 between the active feature group 44 and the dummy feature 46b are obtained by performing the calculation methodology as shown in TABLE 3 or by querying the look-up TABLE 4. As mentioned above, the width of the dummy features 46a/46b is a sum of the outer width $W_A$ and the inner width $W_B$. According to TABLE 3 or TABLE 4, the channel length L'=L2=30, the outer width $W_A$=15, the inner width $W_B$=15, the first spacing width S1=105, the second spacing width S2=105, and the third spacing width S3=105 in the preferred embodiment. After obtaining the aforementioned parameters, STEP 206 is performed to generate the cell pattern 40 in the CAD tool. Subsequently, the cell pattern 40 is outputted to a photo mask and then transferred to a semiconductor substrate 41 including at least an active region 42, and thus a semiconductor layout structure 40C is obtained.

As mentioned above, a cell width W of the semiconductor layout structure 40/the cell pattern 40C is a distance between the cell boundaries 40b as shown in FIG. 6. That is, the cell width W of the semiconductor layout structure 40C/the cell pattern 40 is a sum of the inner width $W_B$ of the dummy feature 46a, the inner width $W_B$ of the dummy feature 46b, the first spacing width S1, the channel lengths L' of all active features 44a in the active feature group 44, all second spacing widths S2 in the active feature group 44, and the third spacing width S3:

$$W = 2*W_B + S1 + n*L' + (n-1)*S2 + S3$$
$$= 2*15 + 105 + 3*30 + 2*105 + 105$$
$$= 540$$

As mentioned above, the semiconductor layout structure 40C/the cell pattern 40 includes a poly pitch P, and the poly pitch P is a sum of the channel length L' of the active feature 44a and the second spacing width S2:

$$P=L'+S2=30+105=135$$

More important, the cell width W of the semiconductor layout structure 40C/the cell pattern 40 provided by the preferred embodiment is a multiple of the poly pitch: W=540=(135)*4=P*4. It is therefore concluded the semiconductor layout structure 40C is an on-grid layout structure.

According to the seventh preferred embodiment of the present invention, STEP 202 is performed, and an active feature group 44 is received. In the preferred embodiment, the active feature group 44 includes a plurality of active features 44a. The active features 44a include a channel length L', and a second spacing width S2 is defined in between any adjacent two active features 44a. According to the preferred embodiment, the channel length L'=L1, the predetermined variable δL=5, and the minimum active feature spacing width S=100 according to a database or a standard cell library. Next, STEP 204 is performed and a pair of dummy features 46a/46b is introduced at two opposite sides of the active feature group 44, and thus a cell pattern 40 is formed. More important, a width of the dummy features 46a/46b, a first spacing width S1 between the active feature group 44 and the dummy feature 46a, the second spacing width S2 between any adjacent two active features 44a in the active feature group 44, and a third spacing width S3 between the active feature group 44 and the dummy feature 46b are obtained by performing the calculation methodology as shown in TABLE 3 or by querying the look-up TABLE 4. As mentioned above, the width of the dummy features 46a/34b is a sum of the outer width $W_A$ and the inner width $W_B$. According to TABLE 3 or TABLE 4, the channel length L'=L1=25, the outer width $W_A$=12.5, the inner width $W_B$=12.5, the first spacing width S1=110, the second spacing width S2=110, and the third spacing width S3=110 in the preferred embodiment. After obtaining the aforementioned parameters, STEP 206 is performed to generate the cell pattern 40 in the CAD tool. Subsequently, the cell pattern 40 is outputted to a photo mask and then transferred to a semiconductor substrate 41 including at least an active region 42, and thus a semiconductor layout structure 40C is obtained.

As mentioned above, a cell width W of the semiconductor layout structure 40/the cell pattern 40C is a distance between the cell boundaries 40b as shown in FIG. 6. That is, the cell width W of the semiconductor layout structure 40C/the cell pattern 40 is a sum of the inner width $W_B$ of the dummy feature 46a, the inner width $W_B$ of the dummy feature 46b, the first spacing width S1, the channel lengths L' of all active features 44a in the active feature group 44, all the second spacing widths S2, and the third spacing width S3:

$$W = 2*W_B + S1 + n*L' + (n-1)*S2 + S3$$
$$= 2*12 + 5 + 110 + 3*25 + 2*110 + 110$$
$$= 540$$

As mentioned above, the semiconductor layout structure 40C/the cell pattern 40 includes a poly pitch P, and the poly pitch P is a sum of the channel length L' of the active feature 44a and the second spacing width S2:

$$P=L'+S2=25+110=135$$

More important, the cell width W of the semiconductor layout structure 40C/the cell pattern 40 provided by the preferred embodiment is a multiple of the poly pitch P: W=540=(135)*4=P*4. It is therefore concluded the semiconductor layout structure 40C is an on-grid layout structure.

Additionally, though the active feature group 44 includes four active features 44a in the fifth to seventh preferred embodiments, the amounts of the active features 44a in the active feature group 44 should not be limited to this. Those skilled in the art would easily realize that the amount of the active features 44a can be increased or decreased depending on different product requirement.

According to the method for designing the semiconductor layout structure provided by the fifth to seventh preferred embodiments, the pair of dummy features 46a/46b is introduced at the two sides of the active feature group 44 to form the cell pattern 40 after receiving the active feature group 44 and obtaining the first dummy width $W_A+W_B$, the spacing width S2 between the active features 44a, and the spacing widths S1/S3 between the dummy feature 46a/46b and the active feature group 44 by calculating or by querying the look-up table. Accordingly, the cell width W of the cell pattern 40 is ensured to be a multiple of the poly pitch P, and thus the final semiconductor layout structure 40C is ensured to be an on-grid layout structure regardless of the size of the channel length L'.

Accordingly, the semiconductor layout structure obtained by performing the method for designing the semiconductor layout structure provided by the present invention, the cell width is always a sum of two times of the inner width $W_B$ of the dummy features, the first spacing width S1, the width of the active feature group (which is a sum of channel length L' of all active features in the active feature group, all the second spacing widths S2), and the third spacing width S3. That is, the semiconductor layout structure obtained by performing the method for designing the semiconductor layout structure provided by the present invention always complies with the following Equation (1):

$$2*W_B+S1+nL+(n-1)(S2)+S3=(n+1)(L+S2) \qquad \text{Equation (1)}$$

In the Equation (1), $W_B$ is referred to the inner width of the dummy feature, S1 is referred to the first spacing width, n is a positive integer larger than 2, L is referred to the channel length, S2 is referred to the second spacing width, and S3 is referred to the third spacing width.

Figure 7:
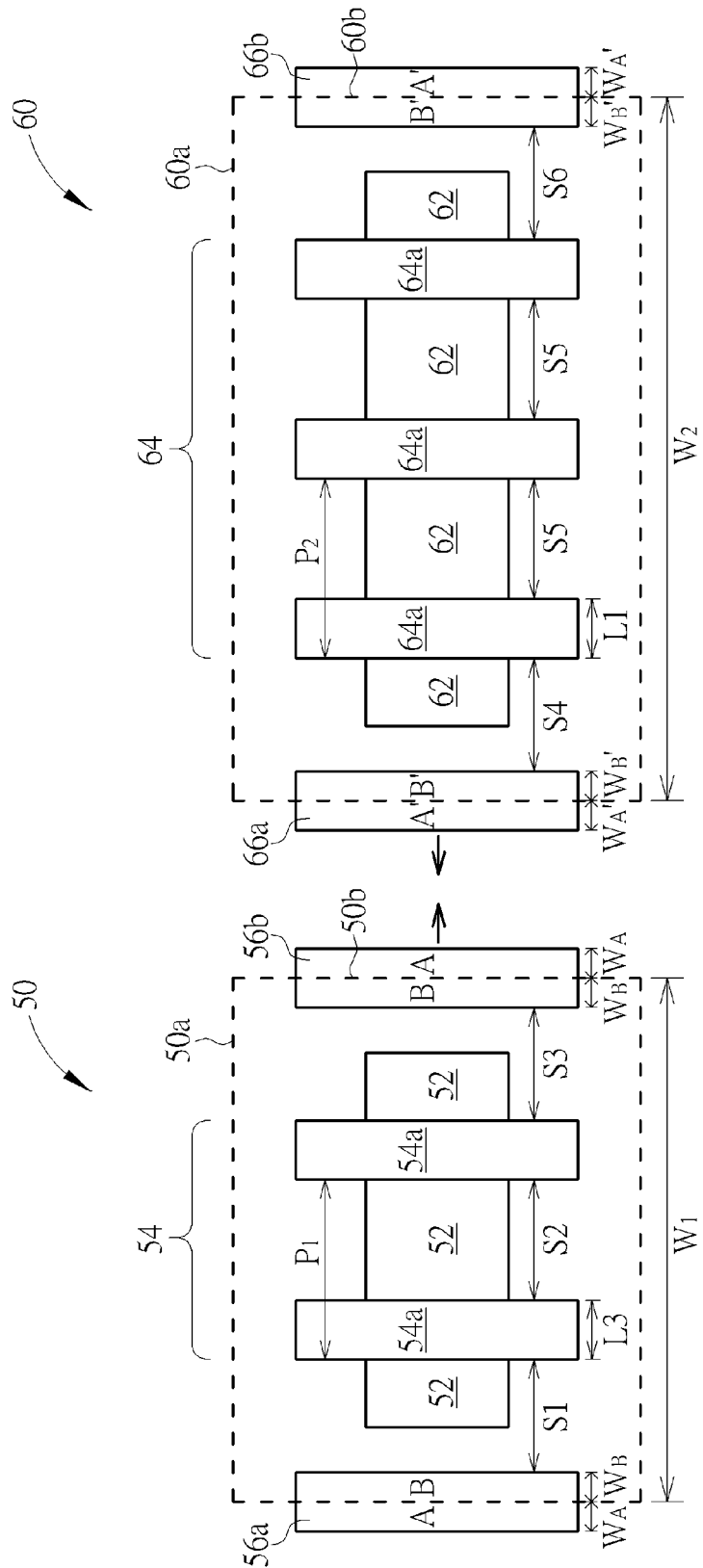
FIGS. 7-9 are schematic drawings illustrating a semiconductor layout structure obtained by performing the method for designing the semiconductor layout structure provided by an eighth preferred embodiment of the present invention.
Figure 8:
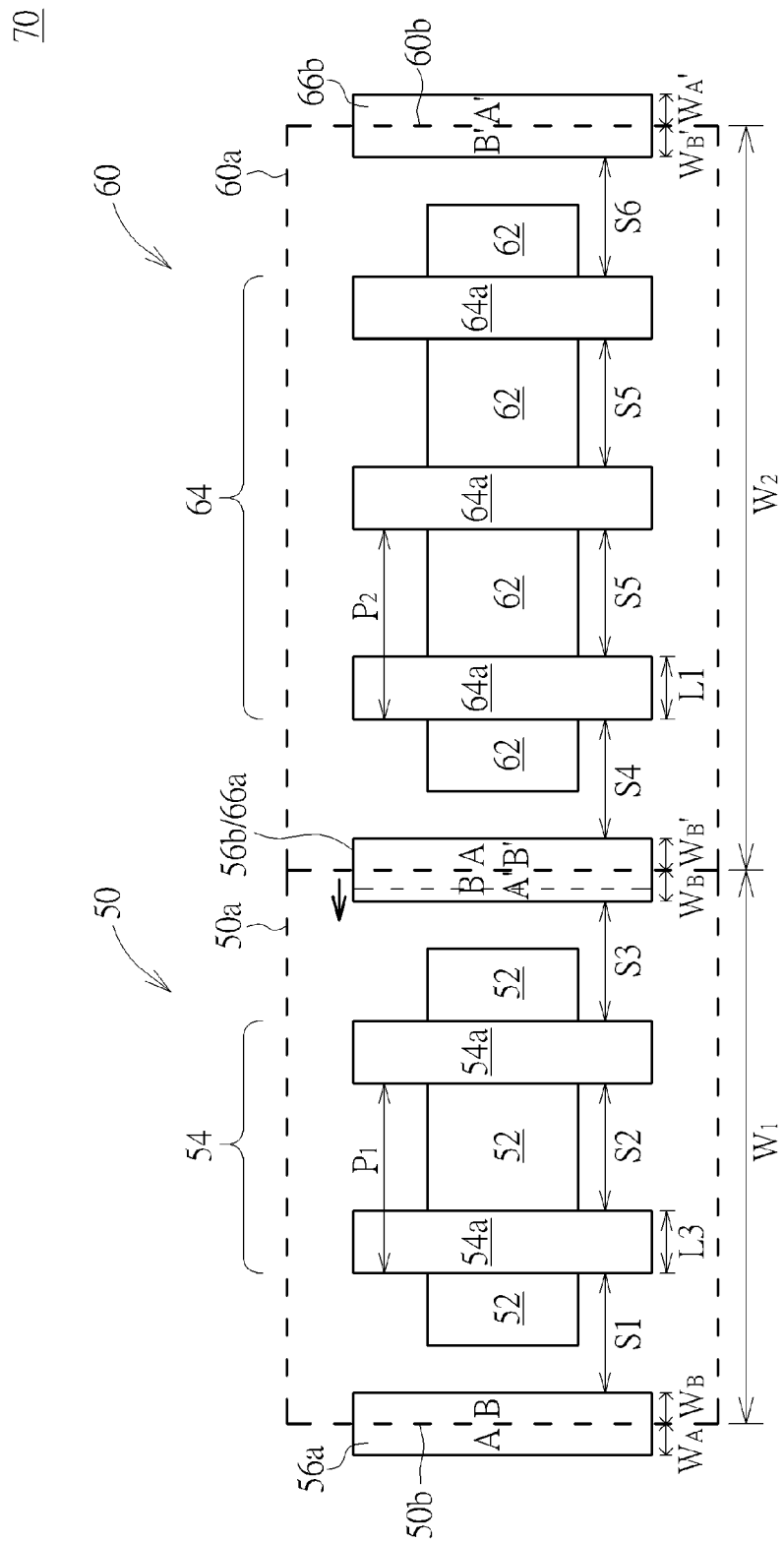
Figure 9:
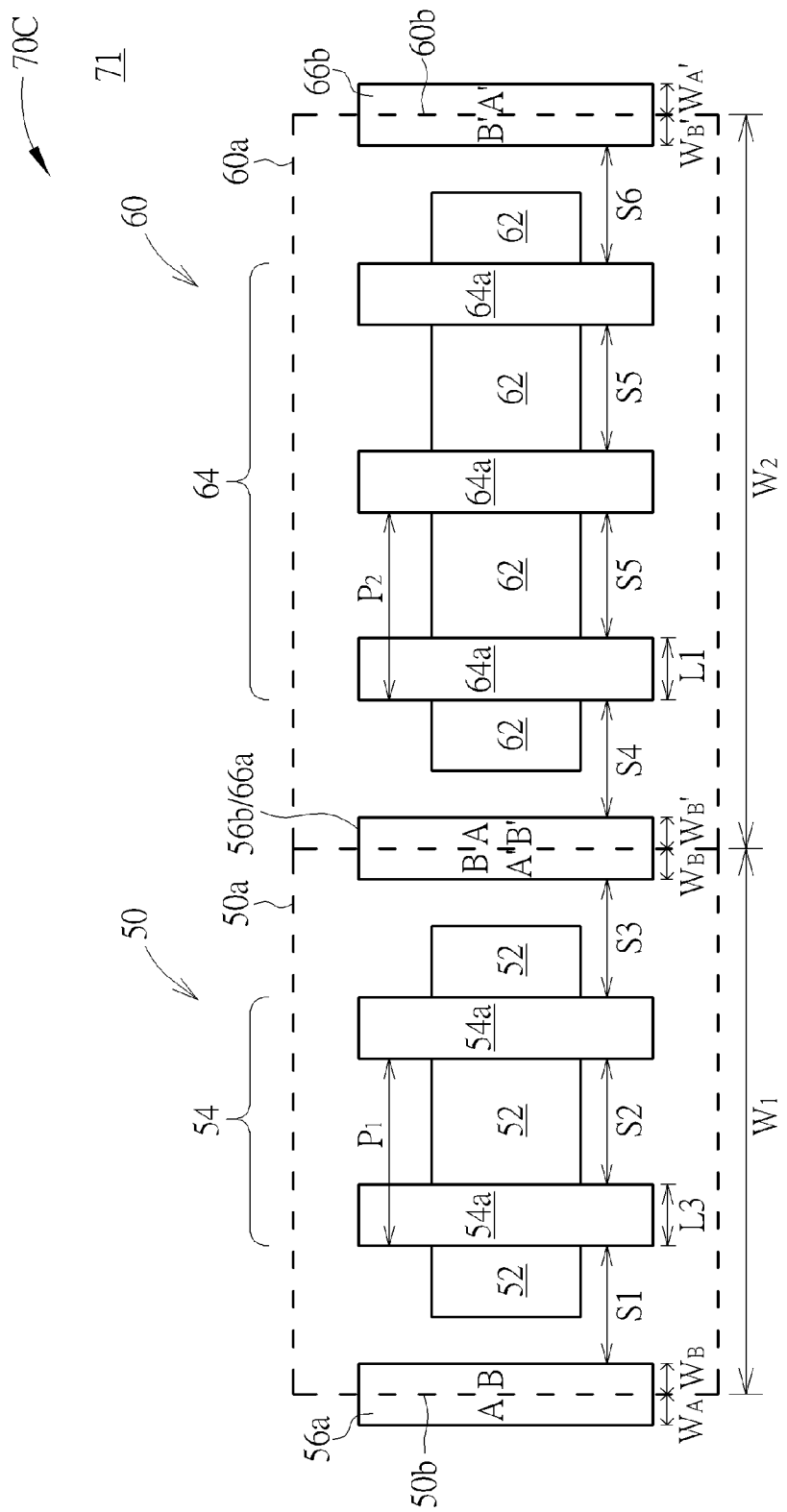

Please refer to FIGS. 7-9, which are schematic drawings illustrating a semiconductor layout structure obtained by performing the method for designing the semiconductor layout structure provided by an eighth preferred embodiment of the present invention. According to the preferred embodiment, the method for designing the semiconductor layout structure 200 can be repeated any number of times. Firstly, an initial channel length L3, a predetermined variable δL, and a minimum active feature spacing width S are received. In the preferred embodiment, the initial channel length L3=40, the predetermined variable δL=5, and the minimum active feature spacing width S=100. Next, STEP 202 and STEP 204 are sequentially performed: A first active feature group 54 is received. The first active feature group 54 includes first active feature (s) 54a, and the first active feature (s) 54a includes a first channel length L'. A pair of first dummy features 56a/56b is introduced at two opposite sides of the first active feature group 54 by performing the calculation methodology or by querying the look-up table, and thus a first cell pattern 50 is formed. In the case that the first active feature group 54 includes a plurality of first active features 54a, STEP 2401 is further performed to obtain a second spacing width S2 defined between any adjacent two first active features 54a. According to the preferred embodiment, the first channel length L'=L3, therefore by performing the calculation shown in TABLE 1 or by querying the look-up TABLE 2, a first dummy width $W_A+W_b$ of the first dummy features 56a/54b is obtained: 15+20=35, a first spacing width S1 between the first dummy feature 56a and the first active feature group 54 is 100, and a third spacing width S3 between the first dummy feature 56b and the first active feature group 54 is 100. Since the first active feature group 54 includes the plurality of the first active features 54a, the second spacing width S2 is obtained by performing the calculation shown in TABLE 1 or by querying the look-up TABLE 2. Accordingly, the second spacing width S2 is 100. The obtained first cell pattern 50 includes a first cell width $W_1$, and since the first cell pattern 50 is to be integrated with other cell patterns, the first cell width $W_1$ is a distance between the cell boundaries 50b as shown in FIG. 7. That is, the first cell width $W_1$ is a sum of the inner width $W_B$ of the first dummy feature 56a, the inner width $W_B$ of the first dummy feature 56b, the first spacing width S1, the channel lengths L' of all first active features 54a in the first active feature group 54, all second spacing widths S2 in the first active feature group 54, and the third spacing width S3:

$$W = 2*W_B + S1 + n*L' + (n-1)*S2 + S3$$
$$= 2*20 + 100 + 2*40 + 1*100 + 100$$
$$= 420$$

As mentioned above, the first cell pattern 50 includes a first poly pitch $P_1$, and the first poly pitch $P_1$ is a sum of the channel length L' of the first active feature 54a and the second spacing width S2:

$$P = L' + S2 = 40 + 100 = 140$$

Accordingly, the first cell width $W_1$ of the first cell pattern 50 is a multiple of the first poly pitch $P_1$. It is therefore concluded the first cell pattern 50 complies with the requirement of being on-grid.

Next, STEP 202 and STEP 204 are sequentially performed again: A second active feature group 64 is received. The second active feature group 64 includes second active feature (s) 64a, and the second active feature (s) 64a includes a second channel length L'. A pair of second dummy features 66a/66b is introduced at two opposite sides of the second active feature group 64 by performing the calculation methodology or by querying the look-up table, and thus a second cell pattern 60 is formed. In the case that the second active feature group 64 includes a plurality of second active features 64a, STEP 2401 is further performed to obtain a fifth spacing width S5 defined between any adjacent two second active features 64a. According to the preferred embodiment, the second channel length L'=L1, therefore by performing the calculation shown in TABLE 1 or by querying the look-up TABLE 2, a second dummy width $W_A'+W_b'$ of the second dummy features 66a/64b is obtained: 15+15=30, a fourth spacing width S4 between the second dummy feature 66a and the second active feature group 64 is 110, and a sixth spacing width S6 between the second dummy feature 66b and the second active feature group 64 is 110. Furthermore, since the second active feature group 64 includes a plurality of second active features 64a in the preferred embodiment, the fifth spacing width S5 between any adjacent two second active features 64a is obtained by performing the calculation shown in TABLE 1 or by querying the look-up TABLE 2. Accordingly, the fifth spacing width S5 is 110. The obtained second cell pattern 60 includes a second cell width $W_2$, and since the second cell pattern 60 is to be integrated with other cell patterns, the second cell width $W_2$ is a distance between the cell boundaries 60b as shown in FIG. 7. That is, the second cell width $W_2$ is a sum of the inner width $W_B'$ of the second dummy feature 66a, the inner width $W_B'$ of the second dummy feature 66b, the fourth spacing width S4, the channel lengths L' of all second active features 64a in the second active feature group 64, all the fifth spacing widths S5 in the second active feature group 64, and the sixth spacing width S6:

$$W = 2*W_B + S4 + n*L' + (n-1)*S5 + S6$$
$$= 2*15 + 110 + 3*30 + 2*110 + 110$$
$$= 560$$

As mentioned above, the second cell pattern 60 includes a second poly pitch $P_2$, and the second poly pitch $P_2$ is a sum of the channel length L' of the second active feature 64a and the fifth spacing width S5:

$$P_2 = L' + S5 = 30 + 110 = 140$$

Accordingly, the second cell width $W_2$ of the second cell pattern 60 is a multiple of the second poly pitch $P_2$. It is therefore concluded the second cell pattern 60 complies with the requirement of being on-grid.

Please refer to FIG. 7 again. The first cell pattern 50 includes two pairs of first cell boundaries 50a/50b, the first cell boundaries 50a are perpendicular to long axis of the first dummy features 56a/56b while the first cell boundaries 50b are parallel with the long axis of the first dummy features 56a/56b. Furthermore, the first cell boundaries 50b penetrate the first dummy features 56a/56b along its long axis, and thus the first dummy features 56a/56b respectively include a first inner portion B and a first outer portion A defined by the first cell boundaries 50b as shown in FIG. 7. The first inner portion B includes a first inner width $W_B$ and the first outer portion A includes a first outer width $W_A$. The second cell pattern 60 also includes two pairs of second cell boundaries 60a/60b, the second cell boundaries 60a are perpendicular to long axis of the second dummy features 66a/66b while the second boundaries 60b are parallel with the long axis of the second dummy features 66a/66b. Furthermore, the second cell boundaries 60b penetrate the second dummy features 66a/66b along its long axis, and thus the second dummy features 66a/66b respectively include a second inner portion B' and a second outer portion A' defined by the second cell boundaries 60b as shown in FIG. 7. The second inner portion B includes a second inner width $W_B'$ and the second outer portion A includes a second outer width $W_A'$.

Please refer to FIG. 8. Next, the first cell pattern 50 and the second cell pattern 60 are abutted. It is noteworthy that during abutting the first cell pattern 50 and the second cell pattern 60, one of the first cell boundaries 50b are made to overlap one of the second cell boundaries 60b. Therefore the first dummy feature 56b of the first dummy features 56a/56b overlaps the second dummy features 66a of the second dummy features 66a/66b. In detail, the first outer portion A of the first dummy feature 56b overlaps the second inner portion B' of the second dummy feature 66a, and the first inner portion B of the first dummy feature 56b overlaps the second outer portion A' of the second dummy feature 66a. As shown in FIG. 8, according to TABLE 1 or TABLE 2, it is understood that the width of the first dummy feature 56b may be different from the width of the second dummy feature 66a: The width of the first dummy feature 56b is a sum of the first outer width $W_A$ and the first inner width $W_B$, that is, the width of the first dummy feature 56b is: 15+20=35 in the preferred embodiment. The width of the second dummy feature 66a is a sum of the second outer width $W_A'$ and the second inner width $W_B'$, thus the width of the second dummy feature 66a is 15+15=30 in the preferred embodiment. In other words, the second outer portion A' of the second dummy feature 66a cannot completely match the first inner portion B of the first dummy feature 56b as emphasized by dotted line shown in FIG. 8: The first inner width $W_B$ of the first inner portion B is different from the second outer width $W_A'$ of the second outer portion A'. Subsequently, the second outer width $W_A'$ is adjusted to be equal to the first inner width $W_B$ as depicted by the Arrow shown in FIG. 8. Consequently, the first cell width $W_1$ of the first cell pattern 50 is still a sum of the first inner width $W_B$ of the first dummy feature 56a, the first inner width $W_B$ of the first dummy feature 56b, the first spacing width S1, the channel lengths L' of all first active features 54a in the first active feature group 54, all second spacing widths S2 in the first active feature group 54, and the third spacing width S3. In other words, the first cell width $W_1$ is still a multiple of the first poly pitch $P_1$ after adjusting the second outer width $W_A'$. The second cell width $W_2$ of the second cell pattern 60 is still a sum of the second inner width $W_B'$ of the second dummy feature 66a, the second inner width $W_B'$ of the second dummy feature 66b, the fourth spacing width S4, the channel lengths L' of all second active features 64a in the second active feature group 64, all fifth spacing widths S5 in the second active feature group 64, and the fifth spacing width S6. In other words, the second cell width $W_2$ is still a multiple of the second poly pitch $P_2$ after adjusting the second outer width $W_A'$. In the same concept, when the first outer width of the overlapped the first outer portion is different from the second inner width of the overlapped the second inner portion, the first outer width is adjusted to be equal to the second inner width.

Please refer to FIG. 9. After adjusting the first outer width $W_A$ and/or the second out width $W_A'$, STEP 206 is performed to generate the abutted first cell pattern 50 and second cell pattern 60 in the CAD tool. Subsequently, the abutted first cell pattern 50 and second cell pattern 60 are outputted to a photo mask and then transferred to a semiconductor substrate 71 including at a plurality of active regions 52/62, and thus a semiconductor layout structure 70C is obtained. In the semiconductor layout structure 70C, the cell width $W_1/W_2$ of the cell pattern 50/60 are always the multiple of the poly pitch $P_1/P_2$ regardless of the size of the cell patterns. Additionally, the first dummy feature 56a and the second dummy feature 56b not overlapped each other can include different widths.

According to the method for designing the semiconductor layout structure provided by the eighth preferred embodiment, STEP 202 and STEP 204 are sequentially performed after receiving the initial channel length L, the predetermined variable 8L and the minimum active feature spacing width S. Thus parameters for the cell pattern 50/60 which include different channel lengths, can be obtained. The parameters includes, as mention above, the width of the dummy features (a sum of the inner width and the outer width), the spacing width between the dummy features and the active feature group, and the spacing width between the active features. Consequently cell patterns including different parameters are obtained and then abutted. When the dummy features of the abutted cell pattern 50/60 do not completely match each other, the outer width is adjusted to be equal to the inner width. Then STEP 206 is performed to generate and output the abutted cell patterns 50/60. Subsequently, the semiconductor layout structure 70C including the abutted cell patterns 50/60 is formed on a substrate 71. It is found that though the channel lengths of the abutted cell pattern 50 and cell pattern 60 are different from each other, the cell widths of the cell patterns in the semiconductor layout structure 70C are always a multiple of the poly pitch.

According to the method for designing the semiconductor layout structure provided by the present invention, the dummy width and the spacing width between the active feature group and the dummy features to be formed are obtained by calculating or by querying a look-up table after receiving the active feature group. Then the pair of dummy features is introduced at the two sides of the active feature group. Accordingly, by providing the dummy width and the spacing widths between the active feature group and the dummy features, the final cell pattern obtains a cell width always being a multiple of the poly pitch, and thus the cell pattern is always anon-grid layout structure. In the case that the active feature group include a plurality of active features, by providing the dummy width, the spacing widths between the active feature group and the dummy features, and spacing width between the active features, the final cell pattern obtains a cell width always being a multiple of the poly pitch, and thus the cell pattern is always an on-grid layout structure. That is, according to the method provided by the present invention, cell patterns including different poly pitches can all be formed to be on-grid patterns. Additionally, when abutting different cell patterns, the dummy features on the cell boundary are overlapped and adjusted according to the inner portion. Consequently, cell patterns including active features of different channel lengths are all on-grid structures. And thus the semiconductor layout structure can be easily integrated into one chip regardless of the size of the cell patterns. Eventually, the semiconductor layout structure and the designing method thereof are able to comply with the integration requirements and to improve the integration efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for designing a semiconductor layout structure, comprising:

receiving a first active feature group and a second active feature group, the first active feature group comprising first active features comprising a same first channel length, the second active feature group comprising second active features comprising a same second channel length which is different from the first channel length, the first active features and the second active features extending lengthwise along a first direction and parallel with one another along a second direction perpendicular to the first direction;

introducing a pair of first dummy features at two sides of the first active feature group to form a first cell pattern and a pair of second dummy features at two sides of the second active feature group to form a second cell pattern, the first dummy features comprising a first dummy width, the first active feature group and one of the first dummy features comprising a first spacing width defined therebetween, and the first active feature group and the other first dummy feature comprising a third spacing width defined therebetween, the second dummy features comprising a second dummy width, the second active feature group and one of the second dummy features comprising a fourth spacing width defined therebetween, and the second active feature group and the other second dummy feature comprising a sixth spacing width defined therebetween, wherein the receiving of the first active feature group and the second active feature group and the introducing of the first dummy features to form the first cell pattern and the second dummy feature to form the second cell pattern are performed in at least a computer-aided design (CAD) tool; and abutting the first cell pattern and the second cell pattern side by side along the second direction by overlapping one of the first dummy features and one of second dummy features wherein the first active features and the second active features are aligned along the second direction, and a width of the overlapped first dummy feature and second dummy feature being smaller than a sum of the first dummy width and the second dummy width, wherein the first cell pattern comprises a first cell width and a first poly pitch where the first cell width is a multiple of the first poly pitch, the second cell pattern comprises a second cell width and a second poly pitch where the second cell width is a multiple of the second poly pitch, and the first poly pitch and the second poly pitch are the same.

2. The method for designing the semiconductor layout structure according to claim 1, wherein the first poly pitch is a sum of the first channel length and the first spacing width or a sum of the first channel length and the third spacing width, alternatively.

3. The method for designing the semiconductor layout structure according to claim 1, wherein any adjacent two first active features comprise a second spacing width defined therebetween.

4. The method for designing the semiconductor layout structure according to claim 3, wherein the first poly pitch is a sum of the first channel length and the second spacing width.

5. The method for designing the semiconductor layout structure according to claim 3, further comprising querying a look-up table to obtain the first dummy width, the first spacing width, the second spacing width, and the third spacing width.

6. The method for designing the semiconductor layout structure according to claim 1, further comprising querying a look-up table to obtain the first dummy width, the first spacing width and the third spacing width.

7. The method for designing the semiconductor layout structure according to claim 1, wherein any adjacent two second active features comprise a fifth spacing width defined therebetween.

8. The method for designing the semiconductor layout structure according to claim 1, wherein the first cell pattern comprises a first cell boundary, the second cell pattern comprises a second cell boundary, each of the first dummy features comprises a first inner portion and a first outer portion defined by the first cell boundary, the first inner portion comprises a first inner width and the outer portion comprises a first outer width, each of the second dummy features comprises a second inner portion and a second outer portion defined by the second cell boundary, the second inner portion comprises a second inner width and the second outer portion comprises a second outer width.

9. The method for designing the semiconductor layout structure according to claim 8, wherein the first outer portion of the first dummy feature overlaps the second inner portion of the second dummy feature, and the first inner portion of first dummy feature overlaps the second outer portion of the second dummy feature.

10. The method for designing the semiconductor layout structure according to claim 9, further comprising adjusting the second outer width to be equal to the first inner width when the second outer width of the second outer portion is different from the first inner width of the first inner portion.

11. The method for designing the semiconductor layout structure according to claim 9, further comprising adjusting the first outer width to be equal to the second inner width when the first outer width of the first outer portion is different from the second inner width of the second inner portion.

12. The method for designing the semiconductor layout structure according to claim 8, wherein the first cell width is a sum of twice the first inner width, a width of the first active feature group, the first spacing width and the third spacing width, and the second cell width is a sum of twice the second inner width, the fourth spacing width, a width of the second active feature group and the sixth spacing width.

13. A semiconductor layout structure comprising:
a substrate;
at least a first cell pattern comprising a first cell width, the first cell pattern further comprising:
a pair of first dummy features, and the first dummy features respectively comprising a first dummy width; and
a first active feature group sandwiched between the pair of first dummy features, the first active feature group comprising first active features comprising a same first channel length, wherein the first dummy features and the first active features extend lengthwise along a first direction and are parallel with one another along a second direction perpendicular to the first direction; and
at least a second cell pattern comprising a second cell width abutting the first cell pattern side by side along the second direction, the second cell pattern further comprising:
a pair of second dummy features, the second dummy features respectively comprising a second dummy width; and
a second active feature group sandwiched in between the pair of second dummy features, the second active feature group comprising second active features comprising a same second channel length different from the first channel length of the first active features, wherein the second dummy features and the second active features extend lengthwise along the first direction and are parallel with one another on the second direction, wherein the first active features and the second active features are aligned along the second direction, the first active feature group comprises a first poly pitch and the second active feature group comprises a second poly pitch, the first cell width is a multiple of the first poly pitch, and the second cell width is a multiple of the second poly pitch, and the first poly pitch and the second poly pitch are the same, one of the first dummy features overlaps one of the second dummy features, and a width of the overlapped first dummy feature and second dummy feature is smaller than a sum of the first dummy width and the second dummy width.

14. The semiconductor layout structure according to claim 13, wherein a width of the first dummy feature and a width of the second dummy feature not overlapped to each other are different from each other.

15. The semiconductor layout structure according to claim 13, wherein the first dummy features respectively comprise a first inner portion and a first outer portion defined by a first cell boundary and the second dummy feature respectively comprise a second inner portion and a second outer portion defined by a second cell boundary.

16. The semiconductor layout structure according to claim 15, wherein the first cell width is a distance between the first cell boundary and the second cell width is a distance between the second cell boundaries.

17. A method for designing a semiconductor layout structure, comprising:

receiving a first active feature group comprising first active features, the first active features are parallel with each other, extending lengthwise along a first direction and having a first channel length and a first poly pitch along a second direction perpendicular to the first direction;

introducing a pair of first dummy features having a first dummy width at two sides of the first active feature group to form a first cell pattern having a first cell width defined by a pair of cell boundaries respectively on an inner area of one of the first dummy features, wherein the first cell width is multiple of the first poly pitch;

receiving a second active feature group comprising second active features, the second active features are parallel with each other, extending lengthwise along the first direction and having a second channel length and a second poly pitch along the second direction, wherein the second channel length differs from the first channel length, and the second poly pitch and the first poly pitch are the same;

introducing a pair of second dummy features having a second dummy width at two sides of the second active feature group to form a second cell pattern having a second cell width defined by a pair of cell boundaries respectively on an inner area of one of the second dummy features, wherein the second cell width is multiple of the second poly pitch, and the receiving of the first active feature group and the second active feature group and the introducing of the first dummy features and the second dummy features are performed in at least a computer-aided design (CAD) tool; and abutting the first cell pattern and the second cell pattern side by side along the second direction by overlapping one of the first cell boundaries and one of the second cell boundaries, wherein the first active features and the second active features are aligned along the second direction, and a width of the overlapped first dummy feature and second dummy feature being smaller than a sum of the first dummy width and the second dummy width.

* * * * *